United States Patent
Thean et al.

(10) Patent No.: US 7,468,313 B2
(45) Date of Patent: Dec. 23, 2008

(54) ENGINEERING STRAIN IN THICK STRAINED-SOI SUBSTRATES

(75) Inventors: Voon-Yew Thean, Austin, TX (US); Victor H. Vartanian, Dripping Springs, TX (US); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 243 days.

(21) Appl. No.: 11/420,849

(22) Filed: May 30, 2006

(65) Prior Publication Data

US 2007/0281435 A1 Dec. 6, 2007

(51) Int. Cl.
*H01L 21/04* (2006.01)
(52) U.S. Cl. ............... 438/511; 438/510; 257/E21.634
(58) Field of Classification Search ............ 438/510, 438/511; 257/E21.634
See application file for complete search history.

(56) References Cited

U.S. PATENT DOCUMENTS

| | | | |
|---|---|---|---|
| 6,689,671 B1 | 2/2004 | Yu et al. | |
| 6,743,687 B1 | 6/2004 | Yu et al. | |
| 6,831,292 B2 | 12/2004 | Currie et al. | |
| 6,881,632 B2 | 4/2005 | Fitzgerald et al. | |
| 2004/0126998 A1 | 7/2004 | Feudel et al. | |
| 2004/0142541 A1 | 7/2004 | Cohen et al. | |
| 2005/0116360 A1 | 6/2005 | Huang et al. | |
| 2005/0277260 A1 | 12/2005 | Cohen et al. | |
| 2007/0045729 A1* | 3/2007 | Hoentschel et al. | 257/344 |

OTHER PUBLICATIONS

International Search Report and Written Opinion.

* cited by examiner

*Primary Examiner*—Bradley K Smith
(74) *Attorney, Agent, or Firm*—Kim-Marie Vo

(57) ABSTRACT

A semiconductor fabrication process preferably used with a semiconductor on insulator (SOI) wafer. The wafer's active layer is biaxially strained and has first and second regions. The second region is amorphized to alter its strain component(s). The wafer is annealed to re-crystallize the amorphous semiconductor. First and second types of transistors are fabricated in the first region and the second region respectively. Third and possibly fourth regions of the active layer may be processed to alter their strain characteristics. A sacrificial strain structure may be formed overlying the third region. The strain structure may be a compressive. When annealing the wafer with the strain structure in place, its strain characteristics may be mirrored in the third active layer region. The fourth active layer region may be amorphized in stripes that run parallel to a width direction of the transistor strain to produce uniaxial stress in the width direction.

20 Claims, 3 Drawing Sheets

US 7,468,313 B2

ENGINEERING STRAIN IN THICK STRAINED-SOI SUBSTRATES

FIELD OF THE INVENTION

The invention is in the field of semiconductor fabrication and integrated circuits and, more specifically, fabrication processes and integrated circuits that employ strained silicon.

RELATED ART

In the field of integrated circuits, strained silicon refers generally to the practice of intentionally stressing the channels of NMOS and/or PMOS transistors to improve carrier mobility or alter other performance characteristics. Biaxially-strained substrates including, but no limited to, Strained-Silicon on Insulator ("strained SOI" or "SSOI") substrates, provide high levels of strain directly in the channel of the devices fabricated on these substrates. This is in contrast to typical process-induced stressors which introduce strain remotely through the addition of stressed materials adjacent or in close proximity to the channel in order to induce a strained channel. However, simultaneously improving the carrier mobility for both types of devices is difficult with a uniformly-strained substrate because PMOS carrier mobility and NMOS carrier mobility are optimized under different types of strain. It would be desirable to implement fabrication processes for modifying strain in biaxially-strained SOI substrate to achieve various substrate strain conditions optimized for different transistor types.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor fabrication process as disclosed herein is suitable for use with a semiconductor on insulator (SOI) wafer. The wafer's active layer is a biaxially strained active layer having first and second regions overlying a buried oxide (BOX layer). A portion of the second region is amorphized to form amorphous semiconductor in the second region to alter at least one strain component in the second region. The wafer may then be annealed to re-crystallize the amorphous semiconductor. A first type of transistor is then fabricated in the first region (e.g., NMOS) and a second type of transistor (e.g., PMOS) in the second region. In some implementations, third and possibly fourth regions of the active layer are processed to alter their strain characteristics so that the strain characteristics of all four active layer regions are different from one another. A sacrificial strain structure may be formed overlying the third active layer region. The sacrificial strain structure may be a tensile or compressive strain structure. When the wafer is annealed with the sacrificial strain structure in place, its strain characteristics are transferred to or mirrored in the third active layer region. The fourth active layer region may be amorphized in stripes that run parallel to a width direction of the transistor strain to produce uniaxial stress in the width direction. Isolation structures are preferably then formed between adjacent active layer regions.

Figure 1:
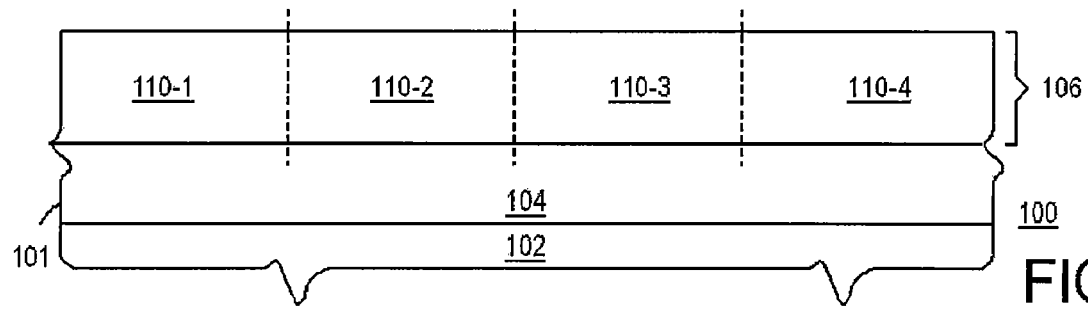
FIG. 1 is a partial cross sectional view of a semiconductor wafer illustrating four active regions overlying a buried oxide layer.

Turning now to the drawings, FIG. 1 is a partial cross sectional view of a semiconductor wafer 101 at an early stage in the fabrication of an integrated circuit. Wafer 101 as depicted in FIG. 1 is a semiconductor on insulator (SOI) wafer in which a semiconductor active layer 106 overlies a buried oxide (BOX) layer 104. BOX layer 104 overlies a bulk substrate 102. Active layer 106 is preferably crystalline silicon. In other embodiments, however, active layer 106 may include silicon compounds such as silicon germanium, silicon carbon, or other compound semiconductors such as gallium arsenide.

In some embodiments, wafer 101 is a strained SOI (SSOI) wafer in which active layer 106 exhibits biaxial strain. Wafer 101 may also be a thick SSOI wafer in which the biaxially strained active layer 106 is a silicon layer having a thickness in the range of approximately 10 to 100 nm.

In the embodiment discussed in greatest detail throughout this disclosure, the biaxial strain exhibited by active layer 106 is biaxially tensile, meaning that active layer 106, at the processing stage represented in FIG. 1, exhibits tensile strain in a first direction, namely, the direction parallel to the plane of cross section, which is sometimes referred to herein as the channel direction. In addition, active layer 106 as depicted in FIG. 1 exhibits tensile strain in a second direction, which is perpendicular to the plane of cross section and is sometimes referred herein as the width direction. Other embodiments may begin with biaxial strained active layers that are biaxially compressive or biaxially strained with one direction being in tensile strain and the second direction being in compressive strain.

The embodiment illustrated in the drawings emphasizes a process suitable to form four types of strained SOI active layer regions 110-1 through 110-4 (generically or collectively referred to herein as active layer region(s) 110) where each active layer region 110 exhibits different strain characteristics. It will be appreciated, however, by those skilled in the field of semiconductor fabrication that any combination of the four different types of strain conditions may be required in any specific implementation.

Figure 2:
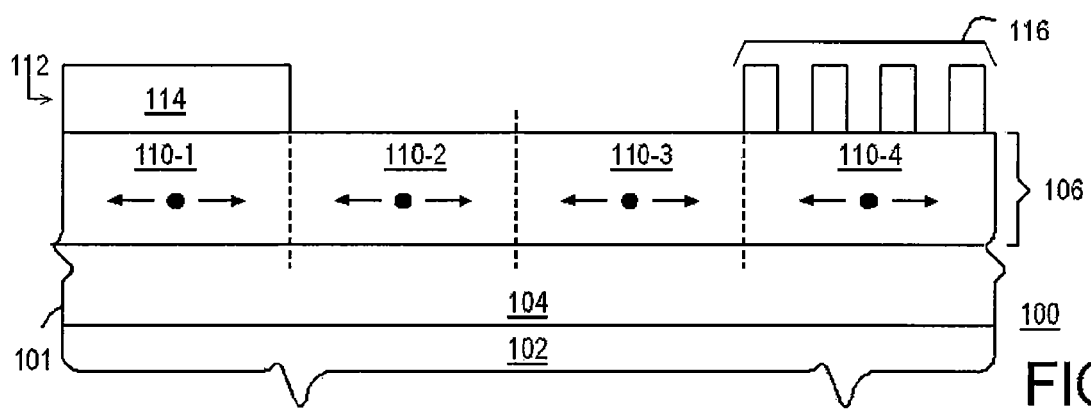
FIG. 2 depicts processing subsequent to FIG. 1 in which a solid mask has been formed overlying a first active region and patterned or striped mask has been formed overlying a fourth active region.

Turning now to FIG. 2, an implant mask 112 is formed overlying active layer 106. In the depicted implementation, implant mask 112 includes a solid or continuous mask portion 114 overly first active layer region 110-1 and a striped mask portion 116 overlying fourth active layer region 110-4. Mask 112 as depicted in FIG. 2 exposes second and third active layer regions 110-2 and 110-3. Mask 112 is preferably formed using conventional photoresist and photolithography processing. In other embodiments, however, Mask 112 may be a hard mask (e.g., an oxide and or nitride mask). FIG. 2 illustrates strain components associated with each active layer region 110-1 through 110-4 by vectors in the plane of cross section and a "dot" representing a strain vector that is perpendicular to the plane of cross section.

Figure 3:
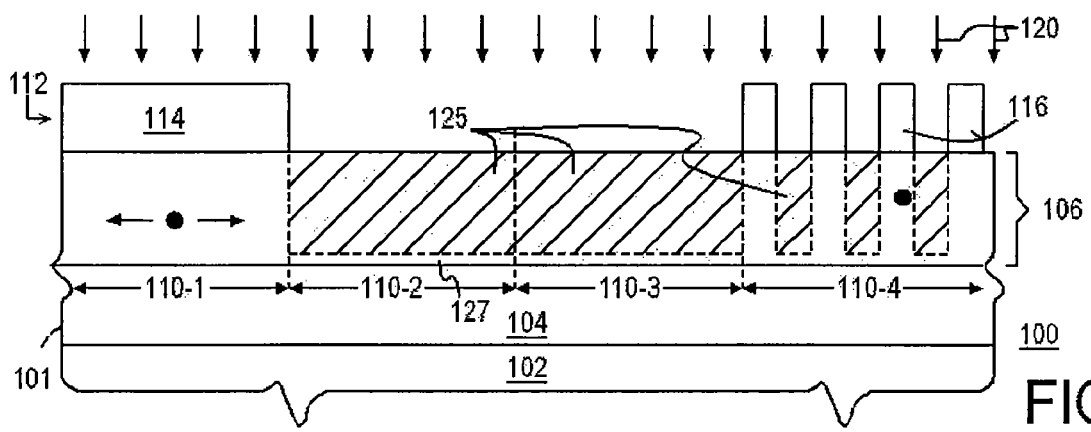
FIG. 3 depicts processing subsequent to FIG. 2 in which an amorphizing implant is performed to form amorphous silicon in the second and third active regions and to form striped regions of amorphous semiconductor in the fourth region.

Turning to FIG. 3, an amorphizing implant 120 is performed to amorphize portions of active layer 106 not protected by mask 112. Specifically with respect to mask 112 as depicted in FIG. 3, amorphization implant 120 creates an amorphous semiconductor region 125 within the portions of active layer 106 that are exposed during implant 120. Amorphizing implant 120 is preferably carried out using a suitable "heavy" implant species (e.g., Ge, Ga, or Xe) using an implant energy in the range of approximately 3 to 45 keV, which scales according to active layer thickness (lower energies for thinner active layers) and an implant dose range of approximately $1\times10^{15}$-$5\times10^{15}$ cm$^{-2}$. As depicted in FIG. 3, amorphous semiconductor region 125 terminates at a position vertically displaced above BOX layer 104. In other words, the depth of amorphous semiconductor region 125 is less than the thickness of active layer 106. Preferably, implant 120 is designed to leave a layer 127 of crystalline material underlying amorphous semiconductor region 125.

Figure 4:
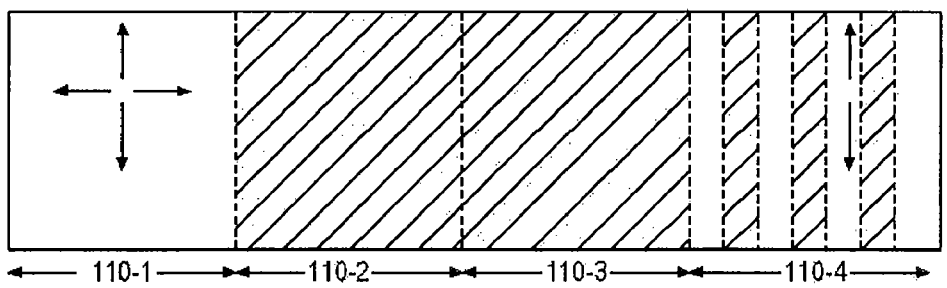
FIG. 4 is a top view of the wafer depicted in FIG. 3, emphasizing strain components of the four active regions.

As suggested by the strain vector components, amorphizing implant 120 alters the strain characteristics of wafer 101. Specifically, amorphizing implant 120 eliminates both components of strain in active layer regions 110-2 and 110-3 and the channel direction strain component in active layer region 110-4. Referring to FIG. 4, a top view of wafer 101 illustrates the presence of biaxial tensile strain in first active layer region 110-1 and a width direction strain component in fourth active layer region 110-4 while active layer region 110-2 and active layer region 110-3 are substantially free of strain following the amorphizing implant. The top view of FIG. 4 illustrates the striped amorphization in fourth active layer region 110-4 is oriented so that continuous stripes of crystalline active layer extend across the region in the width direction. Other implementations may use a striped mask oriented perpendicular to the orientation of striped mask portion 116 (e.g., oriented parallel to the channel direction).

Figure 5:
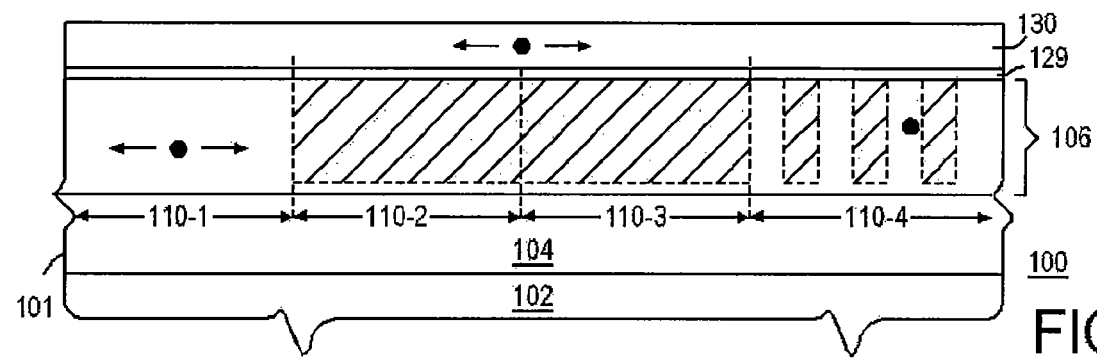
FIG. 5 depicts processing subsequent to FIG. 3 in which a tensile stressor layer is formed overlying the wafer.

In FIG. 5, a tensile stressor 130 is formed overlying wafer 101. In the depicted embodiment, a pad oxide 129 is formed overlying wafer 101 prior to forming a dielectric tensile stressor 130. In one embodiment, tensile stressor 130 is a strongly tensile silicon nitride and pad oxide 129 is a CVD silicon oxide. The manner of depositing tensile stressor 130 is an implementation detail. The concentration of nitrogen, hydrogen and other formation parameters may be altered to control the amount of tension associated with tensile stressor 130.

Figure 6:
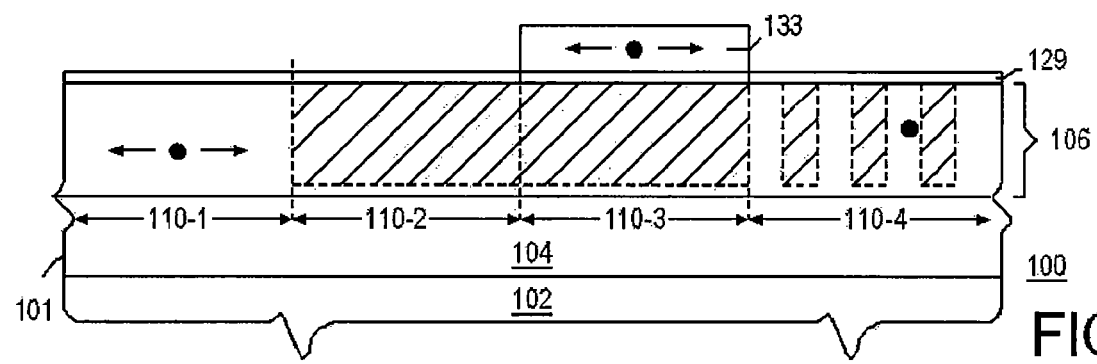
FIG. 6 depicts processing subsequent to FIG. 5 in which the tensile stressor layer is patterned to leave a portion of the compressive strain overlying a third active region of the wafer.

In FIG. 6, tensile stressor 130 is patterned using conventional photolithography and etch processing to form a tensile stressor structure 133 overlying active layer region 110-3. The tensile strain characteristics of tensile stressor structure 133 are indicated by the strain vector depicted in the structure, with the vector arrows pointing away from one another. Tensile stressor structures 133 will be used to introduce compressive strain into the underlying active layer region 110-3, which is depicted by vector arrows pointing towards one another.

Figure 7:
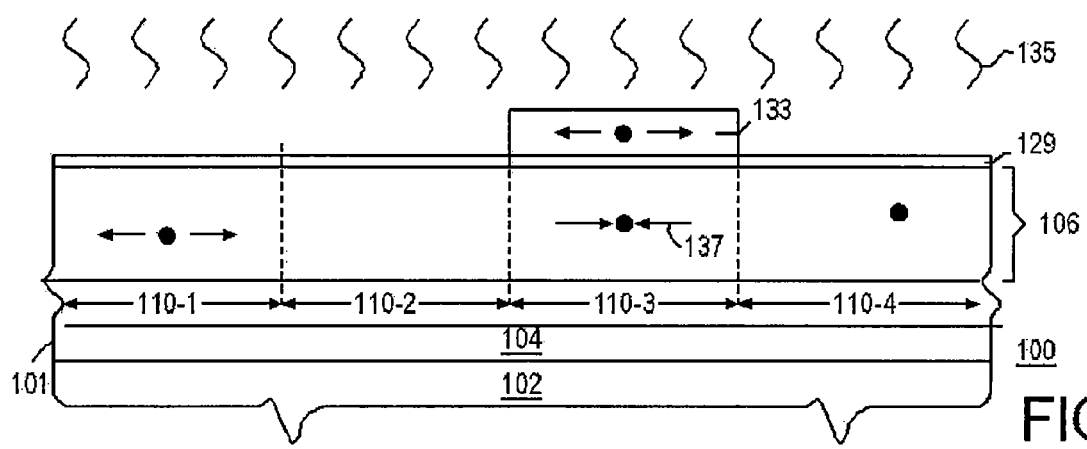
FIG. 7 depicts processing subsequent to FIG. 6 in which an anneal is performed to re-crystallize the amorphous semiconductor.

Turning now to FIG. 7, an anneal 135 is performed to re-crystallize the amorphous semiconductor region 125. The time and temperature of anneal are preferably sufficient to achieve substantially complete re-crystallization of amorphous semiconductor region 125. In one embodiment, anneal 135 includes heating wafer 101 in a neutral or inert ambient (e.g., $N_2$ or Argon) maintained at a temperature in the range of approximately 900 to 1150° C. for a duration in the range of approximately 15 to 30 minutes. In addition to re-crystallizing the previously amorphous semiconductor region 125, anneal 135, when performed with tensile stressor structure 133 positioned over the amorphous semiconductor region 125, results in a strain transfer effect in which the tensile strain in structure 133 produces compression in the re-crystallized active layer region 110-3 as indicated by compressive strain vector 137.

Figure 8:
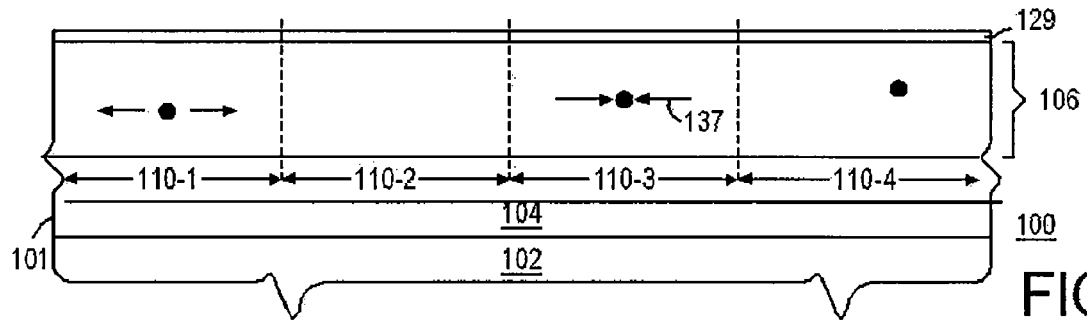
FIG. 8 depicts processing subsequent to FIG. 7 in which the remaining portions of the compressive stressor structure are removed.

Referring to FIG. 8, tensile stressor structure 133 has been removed. Wafer 101 as depicted in FIG. 8 thus includes four different strain characteristics in each of the four active layer region's 110-1 through 110-4. In one embodiment, each of the four active layer region's 110 is used for a different type of device type as referred to in greater detail below. Specifically, first active layer region 110-1 remains under biaxial tensile strain and is a suitable as an active layer region for NMOS transistors, which exhibit improved carrier mobility in biaxially tensile strained regions. Second active layer region 110-2 as depicted in FIG. 8 does not exhibit significant tensile or compressive strain. In an embodiment where tensile stressor structure 133 was sufficiently tensile, active layer region 110-3 as shown in FIG. 8 is in a biaxially compressive state. Active layer region 110-4, on the other hand, is in a uniaxially tensile state exhibiting little or no channel direction strain. As depicted in FIG. 8, pad oxide 129 still remains following removal of tensile stressor structure 133. In some embodiments, pad oxide 129 is stripped or otherwise removed before proceeding to any additional processing. In some embodiments, pad oxide 129 is replaced by a thermal oxide or other dielectric layer prior to any further processing.

Figure 9:
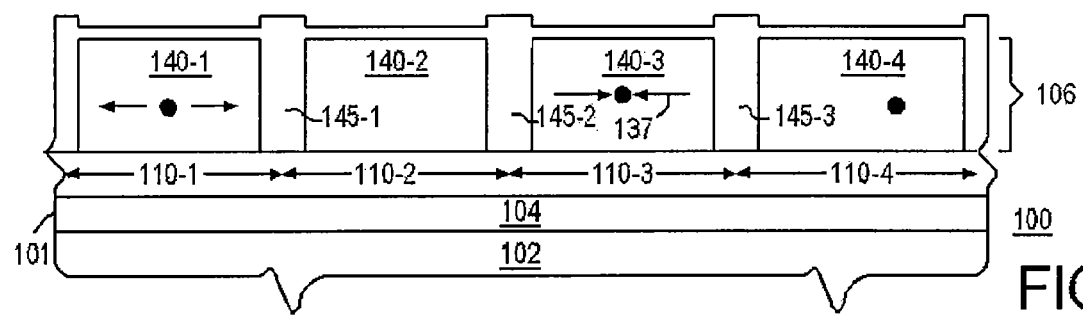
FIG. 9 depicts processing subsequent to FIG. 8 in which isolation structures are formed to isolate the various active regions.

In FIG. 9, isolation structures 145-1 through 145-3 (generically or collectively referred to herein as isolation structure(s) 145). Isolation structures 145 are preferably shallow trench isolation structures of a silicon oxide or other suitable dielectric or combinations of dielectric that extend vertically from an upper surface of wafer 101 to the underlying BOX layer 104. As suggested by their names, isolation structures 145 provide substantially complete physical and electrical isolation between adjacent active layer region's 140.

Figure 10:
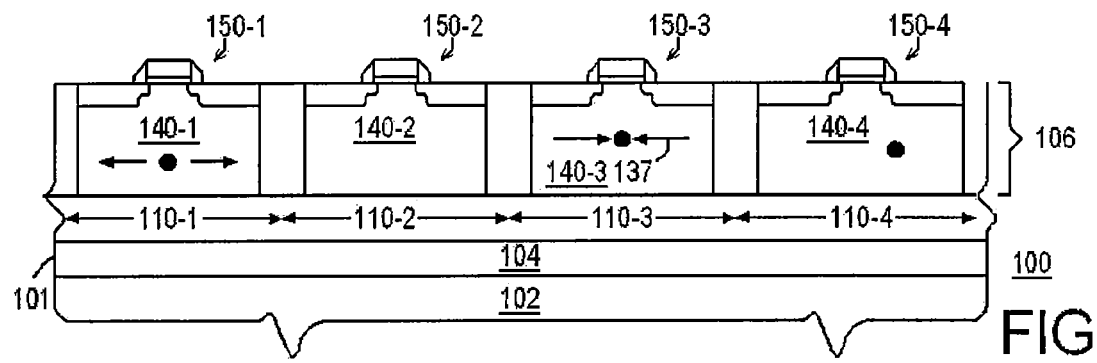
FIG. 10 depicts processing subsequent to FIG. 9 in which transistor devices are formed in each of the active regions.

Turning now to FIG. 10, a portion of an integrated circuit 100 is depicted. In the depicted embodiment, integrated circuit 100 includes transistors or switches 150-1 through 150-4. In one embodiment, first transistor 150-1 is an NMOS transistor formed on biaxially tensile strained active layer region 140-1, second transistor 150-2 is a PMOS device formed over active layer region 140-2, which does not exhibit substantial tensile or compressive strain, third transistors 150-3 is another PMOS device formed overlying a biaxially and compressively strained active layer region 140-3, and fourth transistor 150-4 is a PMOS transistor formed overlying a uniaxially tensile strained active layer region 140-4 where the direction of the uniaxial tensile strain is perpendicular to the plane of cross section.

The processing described above thus uses stress manipulation to fabricate various types of PMOS transistors having different performance characteristics. The different types of PMOS transistors are achieved without altering the lay-out and/or PMOS threshold voltage adjustment implants thereby enabling NMOS:PMOS ratio optimization. For example, each of the three active layer regions 110-2 through 110-4 described above as being a PMOS transistor region may be used for PMOS transistors having different gate lengths (Lg). PMOS transistors for use in fast logic circuits, which require the shortest Lg, may be fabricated in biaxially strained active layer region 110-3. PMOS transistors for use in a 6-transistor (6T) cell, where the NMOS transistors are stronger devices than the relatively weak PMOS transistors, may be implemented in unstrained second active layer region 110-2, while long channel PMOS transistors (e.g., transistors having Lg in excess of 100 nm) are suitably fabricated in fourth active layer region 110-4.

In the foregoing specification, the invention has been described with reference to specific embodiments. However, one of ordinary skill in the art appreciates that various modifications and changes can be made without departing from the scope of the present invention as set forth in the claims below. For example, although the depicted embodiments are illustrated in the context of a transistor having a single gate, strain engineering as described herein may be extended to multiple gate devices such as floating gate devices and other nonvolatile cell transistors. As another example, although the illustrated example employs a starting material that is in tensile strain, other embodiments may be used in conjunction with a starting material that is under biaxial compressive strain, uniaxial strain, and so forth. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process for use with a semiconductor on insulator (SOI) wafer including a biaxially strained active layer having first and second regions overlying a buried oxide (BOX layer), the process comprising:
   amorphizing a portion of the second region to form amorphous semiconductor in the second region;
   annealing the wafer to re-crystallize the amorphous semiconductor;
   fabricating a first type of transistor in the first region and a second type of transistor in the second region wherein the first and second types of transistor differ in conductivity type;
   amorphizing a third region of the active layer and, following said amorphizing and prior to said annealing, forming a sacrificial strain structure overlying the third region; and
   forming a third type of transistor in the third region.

2. The process of claim 1, wherein forming the sacrificial strain structure comprises forming a tensile stressor structure overlying the third region.

3. The process of claim 2, further comprising removing the sacrificial strain structure before fabricating the first and second types of transistors.

4. The process of claim 3, further comprising amorphizing patterned portions of a fourth region and forming a fourth type of transistor.

5. The process of claim 3, wherein said amorphizing patterned portions comprise amorphized stripes oriented in a width direction of the fourth type of transistor.

6. The process of claim 1, wherein said amorphizing patterned portions comprise amorphized stripes oriented in a width direction of the fourth type of transistor.

7. The process of claim 1, wherein a depth of the amorphized portion is less than a thickness of the active layer.

8. The process of claim 1, further comprising removing the sacrificial strain structure before fabricating the first and second types of transistors.

9. The process of claim 1, further comprising amorphizing patterned portions of a fourth region and forming a fourth type of transistor.

10. A semiconductor fabrication process, comprising:
    selectively amorphizing an active layer of a semiconductor wafer to alter stress characteristics of selected regions of the active layer;
    forming a stressor overlying selected regions of the active layer following said amorphizing;
    annealing the active layer to re-crystallize the selected regions following said forming the stressor;
    forming an isolation dielectric between the first and second regions; and
    forming a gate dielectric overlying the first and second regions.

11. The method of claim 10, wherein the active layer is a silicon layer having a thickness in the range of approximately 10 to 100 nm.

12. The method of claim 10, wherein amorphizing the active layer comprises ion implanting an inert species into selected regions of the active layer.

13. The method of claim 10, wherein forming the stressor comprises forming a tensile stressor of silicon nitride.

14. The method of claim 13, wherein forming the tensile silicon nitride stressor comprises forming the stressor selectively overlying at least a portion of said selected regions.

15. The method of claim 10, wherein selectively amorphizing the active layer comprises patterning a mask overlying a region of said active layer, wherein said mask comprises a striped masked oriented to permit continuous stripes of crystalline active layer extending across the active layer in the width direction.

16. The method of claim 10, wherein the active layer is a biaxially strained active layer comprising a first region and a second and wherein selectively amorphizing the active layer comprises amorphizing the second region while maintaining biaxial strain in the first region.

17. The method of claim 16, further comprising subsequently forming an NMOS transistor in the first region and a PMOS transistor in the second region.

18. A semiconductor fabrication process, comprising:
providing a wafer including a biaxially strained active layer overlying a buried oxide layer wherein the biaxially strained active layer is a tensile biaxially strained layer;
amorphizing a second region of the wafer to substantially eliminate at least one component of strain in the second region while maintaining biaxial strain in a first region; and
forming a first transistor of a first conductivity type in the first region and a second transistor of a second conductivity type in the second region, wherein the first transistor is an NMOS transistor and the second transistor is a PMOS transistor.

19. The method of claim 18, further comprising forming a stressor structure overlying the second region after said amorphizing and thereafter annealing the wafer to recrystallize the active layer.

20. The method of claim 18, wherein amorphizing the second region comprises forming a striped mask overlying the second region, the striped mask being oriented in a width direction of the second transistor.

* * * * *